United States Patent [19]  [11] 3,990,102
Okuhara et al.  [45] Nov. 2, 1976

[54] SEMICONDUCTOR INTEGRATED CIRCUITS AND METHOD OF MANUFACTURING THE SAME

[75] Inventors: Shinzi Okuhara, Fujisawa; Ichiro Ohhinata; Masaaki Kusano, both of Yokohama, all of Japan

[73] Assignee: Hitachi, Ltd., Japan
[22] Filed: June 26, 1975
[21] Appl. No.: 590,560

[30] Foreign Application Priority Data
June 28, 1974 Japan.............................. 49-73317
July 19, 1974 Japan.............................. 49-82184

[52] U.S. Cl................................... 357/49; 357/59; 357/89; 357/38
[51] Int. Cl.²................. H01L 27/12; H01L 29/04
[58] Field of Search.................. 357/49, 59, 90, 50, 357/89

[56] References Cited
UNITED STATES PATENTS
3,624,463  11/1971  Davidsohn..................... 357/59
3,817,799  6/1974  Schtze et al. ..................... 357/49

*Primary Examiner*—William D. Larkins
*Assistant Examiner*—Gene M. Munson
*Attorney, Agent, or Firm*—Craig & Antonelli

[57] ABSTRACT

Semiconductor integrated circuits comprising a dielectric isolation semiconductor chip having a plurality of monocrystalline semiconductor regions electrically separated by a polycrystalline semiconductor and dielectric insulation films, and circuit elements formed in the monocrystalline regions, wherein the polycrystalline substrate includes a high resistivity layer and a low resistivity layer, at least the high resistivity layer is adjacent to the monocrystalline region and the low resistivity region is coupled to a contact provided on a surface of the chip, whereby an electrostatic coupling between the circuit elements is shielded by the low resistivity layer to prevent cross-talks due to the electrostatic coupling. A method of manufacturing the same is also disclosed.

6 Claims, 10 Drawing Figures

3,990,102

SEMICONDUCTOR INTEGRATED CIRCUITS AND METHOD OF MANUFACTURING THE SAME

BACKGROUND OF THE INVENTION

1. Field of the Invention

The present invention relates to semiconductor integrated circuits of a dielectric isolation type and a method of manufacturing the same. In particular, the invention concerns such circuits which have a structure for reducing an electrostatic coupling between circuit elements.

2. Description of the Prior Art

Of ways for providing isolation between circuits of semiconductor integrated circuits, the dielectric isolation structure is advantageous over the PN-junction isolation structure in that the parasitic presence of undesirable active elements in the semiconductor chip can be evaded. In the dielectric isolation structure, a perfect insulation in the sense of D.C. current can be assured for the chip by the dielectric insulation films of, for example, $SiO_2$. Further, no electrical connection to the chip substrate (usually made of a polycrystalline semiconductor) has hithertofore been required and therefore the substrate remains in an electrically floating state.

However, the dielectric isolation structure which can be excellently applied to usual applications has a drawback that cross-talks are produced between the circuit elements by an electrostatic coupling due to an electrostatic capacitance formed by the dielectric insulation films and the chip substrate, with the result that a desired performance cannot be obtained in high frequency analog switches or integrated circuits processing super high speed digital signals, for example, integrated circuits of a speech path system in a communication device processing signals of frequencies higher than several MHz.

SUMMARY OF THE INVENTION

An object of the present invention is to provide semiconductor integrated circuits free from the parasitic presence of undesirable active elements in a semiconductor chip.

Another object of the invention is to provide semiconductor integrated circuits in which cross-talks due to an electrostatic coupling between circuit elements is prevented.

Further another object of the invention is to provide semiconductor integrated circuits suitable for packaging such as face-down bonding.

Still another object of the invention is to provide methods of manufacturing such semiconductor integrated circuits.

Semiconductor integrated circuits, according to the invention, comprising a dielectric isolation semiconductor chip having a plurality of monocrystalline semiconductor regions electrically separated by dielectric insulation films in a polycrystalline semiconductor substrate and circuit elements formed in the monocrystalline semiconductor regions, are characterized in that the polycrystalline semiconductor substrate includes a high resistivity layer and a low resistivity layer, at least the high resistivity polycrystalline layer is adjacent to the monocrystalline semiconductor regions and the low resistivity polycrystalline layer is coupled to a contact provided on the chip surface.

DESCRIPTION OF PREFERRED EMBODIMENTS

Figure 1:
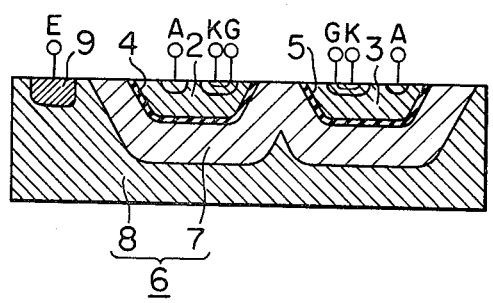
FIG. 1 shows in cross section a first embodiment of semiconductor integrated circuits according to the present invention.

Referring to FIG. 1 which shows in cross section a first embodiment of a semiconductor integrated circuits according to the present invention, reference numeral 1 generally indicates a semiconductor chip which comprises a plurality of monocrystalline regions 2 and 3 formed in a chip substrate 6 with interposition of dielectric insulation films 4 and 5 (hereinafter referred simply to as insulation films). The monocrystalline regions 2 and 3 are usually of a N-type silicon semiconductor material and may be provided with a variety of circuit elements through selective diffusion process made on the upper surface of the chip 1. In the case of the illustrated embodiment, lateral type PNPN switches are shown which can be formed by diffusing twice P- and N-type inpurities. Symbols A, K and G indicate anode, cathode and gate contacts, respectively. Although only two monocrystalline regions are shown, it will be understood that many discrete regions may be formed usually and provided with other various circuit elements such as resistors, diodes, transistors and the like. The insulation films 4 and 5 are usually in a form of thin film of $SiO_2$ (glass) which can be produced through oxidization of the crystalline regions 2 and 3 at a high temperature, and serve for electrically isolating the monocrystalline regions from one another. The chip substrate 6 is of a polycrystalline silicon semiconductor produced by a process hereinafter described in detail and has a layer 7 of a high resistivity in the vicinity of the monocrystalline regions 2 and 3. The remaining portion of the chip substrate 6 constitutes a layer 8 imparted with a low resistivity by a N-type impurity such as phosphorus or a P-type impurity such as boron. The layer 8 is partially exposed on the top surface of the chip 1. It will be noted that a contact region 9 is formed in the low resistivity layer 8 by heavily doping an impurity of the same type as that of the layer 8 through a selective diffusion process or the like. A contact E is connected to the contact region 9. As can be seen in the drawing, the contact region 9 is diffused deeper than the elements formed in the monocrystalline regions 2 and 3. This can be explained by the fact that the polycrystalline semiconductor is several times as high in diffusion rate the monocrystalline semiconductor.

In the above-described first embodiment, the contact region 9 can be simultaneously formed with the formation of the circuit elements in the monocrystalline regions 2 and 3 through a selective diffusion process without requiring additional processing steps. Further, the contact E may be formed simultaneously with the other contacts A, K and G from a material such as aluminium, platinum, gold or the like.

With the structure of the first embodiment of this invention, the path extending from the contact E through the contact region 9 to the low resistivity layer 8 provides a low impedance, when the contact E is grounded. In this connection, it should be noted that the low resistivity layer 8 serves as a shield layer, whereby the electrostatic coupling between the monocrystalline regions 2 and 3 can be substantially reduced. Further, due to the provision of the high resistivity layer 7 between the low resistivity layer and the monocrystalline regions 2 and 3, the high resistivity layer 7 can be formed substantially as an insulator which will then contribute to prevent the impedances of the circuit elements formed in the monocrystalline regions 2 and 3 relative to the ground from being unnecessarily lowered and at the same time to assure the prevention of occurrence of any short circuit even if the insulation films 4 and 5 should be subjected to any failure. On the other hand, due to such a configuration in which the low resistivity layer 8 is partially exposed on the top surface of the chip 1, the packaging of the resulting integrated circuits can be easily effected by a face-down bonding such as flip-chip, beam-lead or the like.

Figure 2:
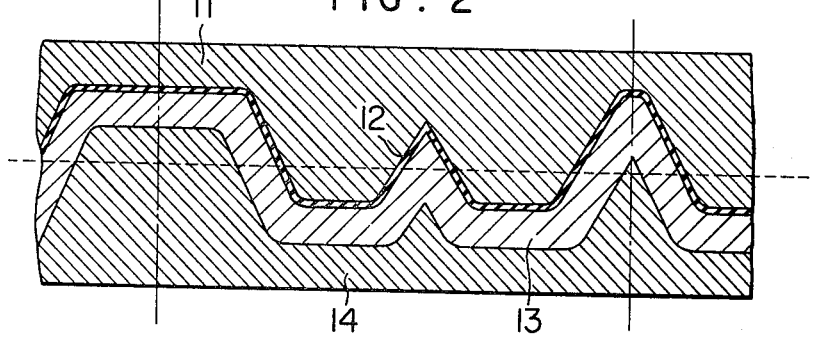
FIG. 2 shows a view for explaining a method of manufacturing the semiconductor integrated circuits of FIG. 1.

Referring to FIG. 2 which shows in cross section the structure of FIG. 1 at a certain manufacturing stop to illustrate the process of manufacturing the structure, one surface of a N-type silicon monocrystalline wafer 11 prepared for a desired resistivity is subjected to a mesa-etching, thereby to form a concave-convex profile of a desired configuration. It will be seen that the depth of etching is non-uniform as illustrated in the drawing. Such a profile can however, be easily realized by appropriately selecting the orientation of the crystal axes of the wafer 11, the composition of an etching solution and the dimension of a photoresist masking pattern. The wafer 11 is then oxidized at a high temperature to form a thin passivating film 12 of SiO$_2$. Thereafter, silicon semiconductor is formed on the contoured surface by a vapor phase growth. Since the substrate therefore is composed of the film 12 of SiO$_2$, the grown silicon semiconductor is of a polycrystalline silicon variously oriented. In this connection, it has been found that a polycrystalline silicon layer 13 having a very high resistivity in the order of that of an electric insulation material can be obtained when the vapor phase growth is effected during the initial phase by using only a silicon source gas of a high purity and a carrier gas. If the vapor phase growth is further continued with addition of a donor or acceptor element gas, a polycrystalline layer 14 of a low resistivity can be produced. On the state after the vapor phase growth, the surface of the polycrystalline silicon (lower surface as viewed in FIG. 2) has in reality a wave-like contour in compliance with the concave-convex profile formed in the wafer. It should be noted that the state shown in FIG. 2 is the one attained after being polished flatly. Subsequently the upper portion lying over the height indicated by a broken line is removed by a polishing etch treatment. The thus obtained structure is then subjected to the diffusion process to form the circuit elements and the contacts are provided. Finally, the structure is cut along the vertical dotted lines, whereby an integrated circuit chip having the structure shown in FIG. 1 can now be produced.

Figure 3:
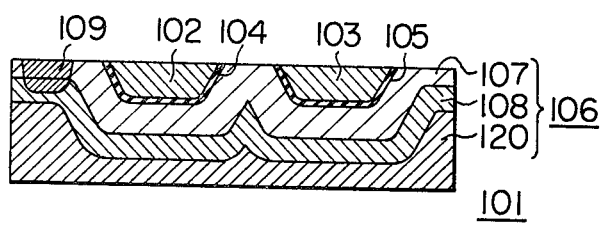
FIGS. 3, 4, 5 and 6 show in cross section second, third, fourth and fifth embodiments of semiconductor integrated circuits according to the invention, respectively.

Next referring to FIG. 3 which shows a second embodiment of semiconductor integrated circuits according to the invention, a low resistivity layer 108 is sandwiched between layers 107 and 120 of a high resistivity. In this embodiment, the layer 108 is not directly exposed at the upper surface of the chip 101. However, since a contact region 109 is coupled with the inner layer 108 of a low resistivity extending within the chip 101, advantageous effect such as described above in connection with the first embodiment shown in FIG. 1 can be accomplished also in the embodiment shown in FIG. 3. This structure can be manufactured in a similar manner as described in conjunction with the first embodiment, that is, by admixing a donor or acceptor element gas temporarily during the vapor phase growth of the polycrystalline silicon and by selecting appropriately the etching depth of the monocrystalline wafer and the dimension to be polished. In addition to the effects similar to those of the first embodiment (i.e. the reduction of electrostatic coupling between the monocrystalline layers 102 and 103, the prevention of short-circuit as caused by any possible failure in the insulation films 104 and 105 as well as the feasibility of face-down bonding), the second embodiment shown in FIG. 3 provides an advantage that the circuit elements formed in the monocrystalline regions 102 and 103 are protected from any contamination, since the low resistivity layer 108 is not substantially exposed on the upper or lower surface of the chip 101. Such a contamination otherwise would occur due to the auto-doping from the low resistivity layer 108 during the formation of the circuit element in the regions 102 and 103. In FIG. 3, the circuit elements and contacts are omitted from illustration.

Figure 4:
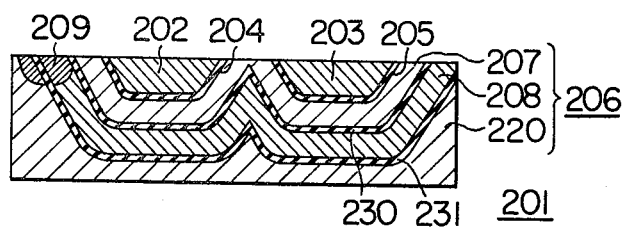

FIG. 4 shows a third embodiment of semiconductor integrated circuits according to the present invention. In the embodiment shown in FIG. 4, the low resistivity layer 208 sandwiched between the high resistivity layers 207 and 220 has discrete insulation films 230 and 231 at the interfaces with the layers 207 and 220, respectively. Thin films of SiO$_2$ which can be produced in the vapor phase growth process can be suitably used as the insulation films 230 and 231. With the structure shown in FIG. 4, any possibility of impurity element (donor or acceptor) being diffused into the high resistivity layers 207 and 220 from the lower resistivity layer 208 during any other heat treatment can be completely inhibited by the insulation films 230 and 231, whereby more uniform shielding effect by the low resistivity layer can be accomplished. The sandwich structure shown in FIG. 4 may be superposed in a multi-layer form. The other regions of the embodiment shown in FIG. 4 have similar function as those of the embodiments shown in FIGS. 1 and 3 and are denoted by the reference numerals having the same time less significant digits.

Figure 5:
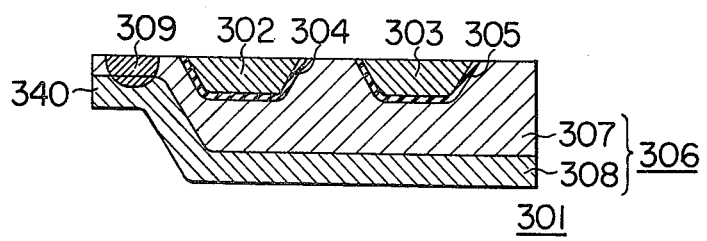

FIG. 5 shows a fourth embodiment of semiconductor integrated circuits according to the invention. In the case of the embodiments described hereinbefore, the low resistivity layer is formed during the vapor phase growth of polycrystalline semiconductor. To the contrary, in the case of the embodiment shown in FIG. 5, a polycrystalline substrate 306 of a high resistivity is first formed by the vapor growth process and thereafter the low resistivity layer 308 is formed by diffusing an impurity from the lower or rear surface. The remaining portion then constitutes a high resistivity layer 307. Since it is necessary to provide electrodes at the upper or front surface of the chip 1, a thin portion 340 is formed in the chip 1 at the polycrystalline substrate 340, the thickness of the thin portion 340 being so selected that the regions doped with impurities by diffusion from the upper and the lower surfaces may be partially overlapped to each other. In the embodiment shown in FIG. 5, the thin portion 340 is formed at one end of the chip 1. However, in view of a required mechanical strength, the thin portion may be provided at a central region of the chip. Further, if desired, the thin portion may be replaced by a through-hole having the contact region 309 around the edge thereof. The diffusion from the lower surface of the chip may be carried out simultaneously with the diffusion for forming the circuit element at the monocrystalline region, as is in the case of the diffusion at the contact forming region. The manufacturing process of the embodiment shown in FIG. 5 can be advantageously applied to the case where the low resistivity layer is to be formed by doping with impurity element having a high toxicity such as arsenic or the like, since no donor or acceptor element is introduced during the vapor phase growth. It will be noted that also in the embodiment shown in FIG. 5 the regions denoted by the reference numerals having same time less significant digits serve for the functions corresponding to those of the regions of the processing embodiments indicated by the same reference digits.

Figure 6:
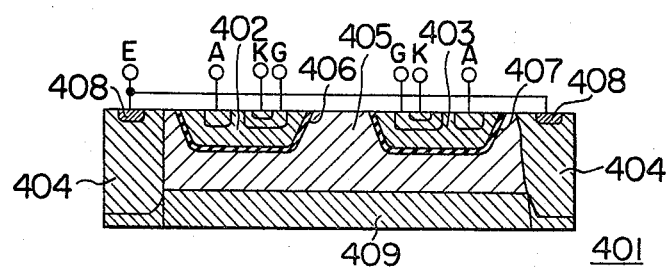

Referring next to FIG. 6 which shows in cross section a fifth embodiment of semiconductor integrated circuits according to the invention, the semiconductor chip 401 comprises first monocrystalline region 402 and 403, a second monocrystalline region 404, a polycrystalline region 405 and insulation films 406 and 407. The first monocrystalline regions 402 and 403 are usually of N-type silicon semiconductor material and adapted to be formed with circuit elements by a selective diffusion process effected from the upper surface of the chip 1. In FIG. 6, lateral type PNPN switches are formed by the diffusion effected twice for the P- and N-type impurities. In FIG. 6, A, K and G denotes respectively lead terminals for anode, cathode and gate. Although only two first monocrystalline regions are shown in the drawing, it will be understood that there are usually many divided corresponding regions and other variety of circuit elements such as resistance, diode, transistor or the like are provided. The second monocrystalline region 404 is of N-type silicon semiconductor having a relatively high resistivity manufactured in a manner hereinafter described and provided around the chip. A low resistivity region 408 of N-type for the connection of contacts is formed in the second monocrystalline region 404 by the diffusion. It is noted that the second monocrystalline region 404 extends through the chip from the upper surface to the lower surface thereof. The polycrystalline region 405 is of a silicon polycrystal having a high resistivity manufactured by the process described hereinafter and constitutes a substrate for the chip 401. The insulation films 406 and 407 are formed of SiO$_2$(glass) produced usually by oxidizing the first monocrystalline regions 402 and 403. By means of these insulation films 406 and 407 together with the high resistivity polycrystalline region 405, the first monocrystalline regions are well insulated in respect of D.C. current so that a plurality of independent circuit elements may be formed. The chip 401 is further provided with a N-type region 409 of a low resistivity extending over the lower surface thereof through a diffusion process. Since the diffusion rate of impurity in the polycrystalline region is several times as high as that of the monocrystalline region, the N-type region 409 of a low resistivity is shallow in the second monocrystalline region 404 and deep in the polycrystalline region 405, as can be seen in FIG. 6. The N-type low resistivity regions 408 and 409 can be manufactured simultaneously with the formation of circuit elements at the first monocrystalline regions 402 and 403 at a diffusion step without incurring additional manufacture costs.

With the arrangement as mentioned above, when the terminal E is grounded, a circuit path providing a low impedance is completed between the terminal E and the region 409 through the region 408 and the second monocrystalline region 404, as is the case in the proceeding embodiments. Due to the shield action of the region 409, any possible electrostatic coupling between the first monocrystalline regions 402 and 403 is essentially excluded.

Since the second monocrystalline region 404 serves as an electrical conduction path between the regions 408 and 409, it is desirable that the region 404 has a low resistance. However, because this region 404 is formed simultaneously with the polycrystalline region 405, it has a tendency of having a relatively high resistivity. To evade such disadvantage, the region 404 is formed around the periphery of the chip 401 so as to have a large area providing a low resistance. In general, the polycrystalline silicon manufactured together with the monocrystalline silicon in the same process has a resistivity greater than the latter by one or more magnitudes. Accordingly, it is possible to use the monocrystalline region as an electrical conduction path, while the polycrystalline region is used as insulation. Although the regions 408, 404 and 409 are illustrated as having N-conductivity, it will be understood that these regions may be P-type, since they serve merely for conduction paths. Further, the grounding of the terminal E may be effected either in the sense of d.c. current, a battery or a.c. current through a capacitor.

Figure 7:
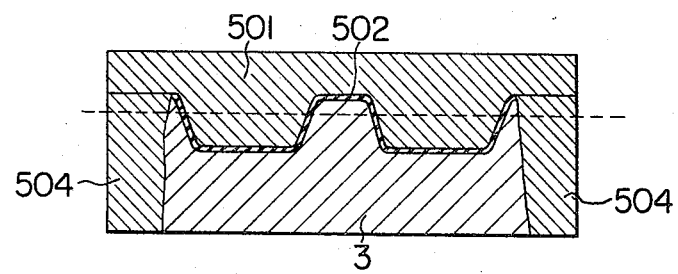
FIG. 7 shows a view for explaining a method of manufacturing the semiconductor integrated circuits of FIG. 6.

FIG. 7 shows in cross section a structure of the embodiment shown in FIG. 6 at a manufacturing step to illustrate the manufacturing process thereof. Referring to FIG. 7, a N-type silicon monocrystalline wafer 501 prepared for a desired resistivity is subjected to a mesa-etching treatment, thereby to form a desired convex-concave profile at one surface thereof, which is then oxidized at a high temperature to form a stable thin film 502 of SiO$_2$. Subsequently, the SiO$_2$ layer 502 is selectively removed at a portion where the second monocrystalline region is to be formed. Thereafter when the profiled surface is subjected to the vapor phase growth treatment of silicon, polycrystalline silicon 503 will grow on the film of SiO$_2$, while monocrystalline silicon 504 is deposited by the growth over the area where the film SiO$_2$ has been removed. Because such vapor phase growth results in polycrystalline silicon having an extremely high resistivity substantially in the order of the resistivity of a usual electrical insulation material, the vapor phase growth is carried out in an atmosphere of gas containing substantially no impurity except for silicon source gas or containing a controlled, extremely small amount of impurity gas of N- or P-type. It has been experimentally determined that the monocrystalline silicon film 504 has a very low resistivity as compared with the polycrystalline silicon film 503 which grown concurrently with the former. By removing then the overlying portion indicated by the broken line through polishing or the like process, the structure shown in FIG. 6 can be attained which comprises the first monocrystalline regions, second monocrystalline region, polycrystalline region and the insulation film as hereinbefore described.

Figure 8:
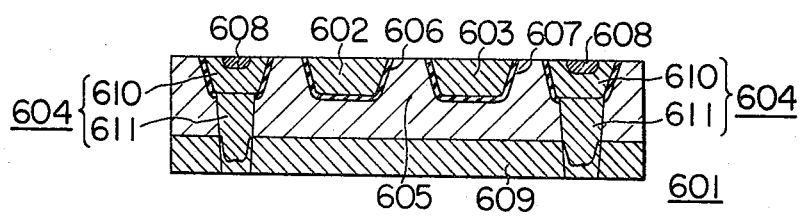
FIGS. 8, 9 and 10 show in cross section sixth, seventh and eighth embodiments of semiconductor integrated circuits according to the invention, respectively.

FIG. 8 shows a sixth embodiment of the invention which is substantially similar to the one shown in FIG. 6 except for the arrangement of the second monocrystalline region 604. More specifically, in the case of the structure shown in FIG. 8, the second monocrystalline region 604 has a portion 610 in the vicinity of the upper surface of the chip 601, which portion 610 is made of adjusted N-type silicon semiconductor material same as that of the first monocrystalline regions 602 and 603, and further has a monocrystalline portion 611 grown simultaneously with the polycrystalline region 605 and extending from the interior of the chip to the lower surface thereof. These portions 610 and 611 are generally termed a second monocrystalline region 604. With such an arrangement, the surface portion 610 of the second monocrystalline region 604 has the identical property with those of the first monocrystalline regions 602 and 603 and the region 604 may therefore be formed with a PNP transistor for use as an emitter-grounded circuit or a NPN transistor with collector grounded. The other remaining regions are same as those of the embodiment shown in FIG. 6 and designated by the same reference numerals used in FIG. 6 but added with 600. It is to be noted that, in the case of the structure shown in FIG. 8, the portions 610 and 611 are doped with impurity of the same property, because otherwise a rectifying junction (diode) could be formed between these portions, whereby shielding effect might be degraded. Further, it should be appreciated that the portion 611 is generally imparted with a higher resistivity than the portion 610.

Figure 9:
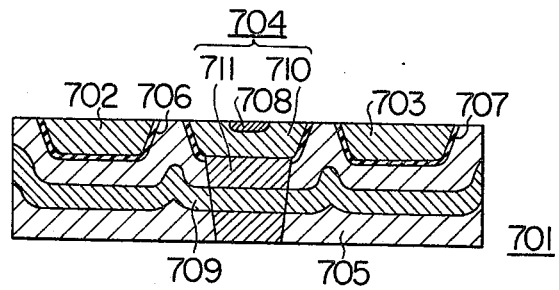

FIG. 9 shows a seventh embodiment of the invention. Contrary to the embodiments of FIGS. 6 and 8 in which the shield layer is formed by the diffusion from the lower surface of the chip, the shield layer of the structure shown in FIG. 9 is formed of a low resistivity region 709 which is produced by a great amount of impurity element admixed to silicon source gas temporally during the vapor phase growth of the polycrystalline and the monocrystalline regions. On the structure shown in FIG. 9, the second monocrystalline region 704 is provided at the centre portion of the chip by way of a non-restrictive example. When the low resistivity region 709 is formed by a vapor phase growth treatment, the distance from the first monocrystalline regions 702 and 703 to the region 709 as well as the thickness of the region 709 can be easily controlled substantially at any desired constant values, whereby a more uniform shielding effect may be attained. The other regions having same functions as those of the structure shown in FIG. 6 or 8 are designated by the reference numerals having same two less significant digits.

Figure 10:
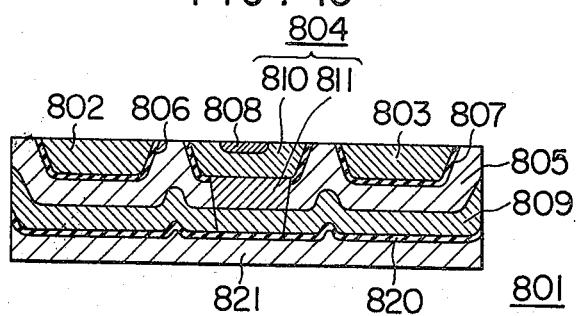

FIG. 10 shows a eighth embodiment of the invention which is substantially similar to the one shown in FIG. 9 except that, after the low resistivity region 809 serving as the shielding layer has been formed, another polycrystalline region 821 is formed through the vapor phase growth process with an insulation layer 820 interposed. In the structures illustrated in FIGS. 6 to 9, the second monocrystalline region extends through the chip from the upper surface to the lower surface. However, it will be noted that the second monocrystalline region 804 is terminated short of the lower surface in the structure shown in FIG. 10. With such an arrangement, the intended effect can be equally attained. In most cases, the insulation layer 820 is formed of a thin film of $SiO_2$. Further, the insulation layer 820 and the polycrystalline region 821 may be arrayed in a supperposed multi-layer arrangement. Such a structure will contribute to a reduction in a thermal distortion of the semiconductor wafer prior to the cutting into the chip configuration. The other regions of the structure shown in FIG. 0 serve for the same function as those of the corresponding regions in the preceeding embodiments and are designated by the reference numerals having same two less significant digits.

In the foregoing description, the monocrystalline region has been assumed as of a N-type silicon semiconductor material. However, it will be appreciated that the N-type silicon semiconductor material or other semiconductor materials may be used, when occasion requires. Although the contact regions of all the embodiments have been described as formed by the diffusion or the like treatment, it will be appreciated that the electrode may be directly contacted to the low resistivity layer in the case the latter is exposed on the chip surface. For grounding the low resistivity layer so as to make it serve as the shield layer, the electrode may be directly grounded as described hereinbefore or alternatively may be grounded through a capacitor, battery or other circuitry providing a low impedance in respect of A.C. current.

As will be understood from the above description, there has been provided according to the invention a dielectric insulation isolated semiconductor device in which a polycrystalline semiconductor substrate is so selectively formed that a portion thereof constitutes a high resistivity layer with another portion constituting a low resistivity layer, and an electrical connection is formed to the low resistivity layer from the chip surface. According to another feature of the invention, the fact that a great difference in the resistivity is present between the polycrystalline semiconductor and the monocrystalline semiconductor which have been formed by a simultaneous vapor phase growth process is utilized to form the insulation by the polycrystalline region and the conductor by the monocrystalline region, while the region of a lowered resistivity formed within the chip or on the lower surface thereof is electrically lead to the upper surface of the chip, thereby accomplish the intended structure of the dielectric insulation isolated semiconductor device. By virtue of such arrangement, the disadvantageous electrostatic coupling among the circuit elements from which hithertofore known dielectric insulation isolated devices have suffered can be effectively removed. Additionally, due to a novel feature that all the contacts are disposed in the same plane according to the invention, integrated circuits are obtained which can be conveniently packed by a facedown bonding method or the like.

We claim:

1. Semiconductor integrated circuits comprising a dielectric isolation semiconductor chip having a plurality of monocrystalline semiconductor regions in a polycrystalline semiconductor substrate electrically separated by dielectric insulation films, circuit elements being formed in the monocrystalline regions, wherein the polycrystalline substrate includes a high resistivity layer and a low resistivity layer, the high resistivity layer is adjacent to the monocrystalline regions and the low resistivity layer is coupled to a contact provided on a surface of the chip.

2. Semiconductor integrated circuits according to claim 1, wherein the low resistivity layer is connected to the contact through a contact region.

3. Semiconductor integrated circuits according to claim 2, wherein the contact region is a monocrystalline semiconductor region formed around the periphery of the high resistivity layer.

4. Semiconductor integrated circuits comprising a dielectric isolation semiconductor chip having a plurality of monocrystalline semiconductor regions in a polycrystalline semiconductor substrate electrically separated by dielectric insulation films, circuit elements being formed in the monocrystalline regions, wherein the polycrystalline substrate includes a first high resistivity layer, a low resistivity layer and a second high resistivity layer in this order, one of the first and second high resistivity layers is adjacent to the monocrystalline regions and the low resistivity layer is connected through a contact region to a contact provided on a surface of the chip.

5. Semiconductor integrated circuits comprising a dielectric isolation semiconductor chip having a plurality of monocrystalline semiconductor regions in a polycrystalline semiconductor substrate electrically separated by dielectric insulation films, circuit elements being formed in the monocrystalline regions, wherein the polycrystalline substrate includes a first high resistivity layer, and low resistivity layer and a high resistivity layer in this order, an insulation film being provided between the low resistivity layer and at least one of the first and second high resistivity layers, one of the first and second high resistivity layers is adjacent to the monocrystalline regions and the low resistivity layer is coupled to a contact provided on a surface of the chip.

6. Semiconductor integrated circuits comprising a dielectric isolation semiconductor chip having a plurality of monocrystalline semiconductor regions in a polycrystalline semiconductor substrate electrically separated by dielectric insulation films, circuit elements being formed in the monocrystalline regions, wherein the polycrystalline substrate includes a first high resistivity layer, a low resistivity layer and a second high resistivity layer in this order, one of the first and second high resistivity layers is adjacent to the monocrystalline regions and the low resistivity layer is connected, through a monocrystalline semiconductor region formed around the periphery of the one high resistivity layer, to a contact provided on a surface of the chip.

* * * * *